US007531059B2

(12) United States Patent
Carpenter et al.

(10) Patent No.: US 7,531,059 B2
(45) Date of Patent: May 12, 2009

(54) CLEANING OF SEMICONDUCTOR WAFERS BY CONTAMINATE ENCAPSULATION

(75) Inventors: Nicole S Carpenter, Burlington, VT (US); Joseph R Drennan, Winooski, VT (US); Alison K Easton, South Burlington, VT (US); Casey J Grant, Hinesburg, VT (US); Andrew S Hoadley, Belvidere, VT (US); Kenneth F McAvey, Jr., Winooski, VT (US); Joel M Sharrow, South Hero, VT (US); William A Syverson, Colchester, VT (US); Kenneth H Yao, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 702 days.

(21) Appl. No.: 10/798,816

(22) Filed: Mar. 10, 2004

(65) Prior Publication Data

US 2004/0169012 A1 Sep. 2, 2004

Related U.S. Application Data

(62) Division of application No. 09/892,954, filed on Jun. 27, 2001, now Pat. No. 6,776,171.

(51) Int. Cl.
*H01L 21/00* (2006.01)
*C23C 16/00* (2006.01)
*C23C 14/00* (2006.01)

(52) U.S. Cl. ...................... 156/345.1; 134/1.2; 134/1.3; 134/4; 134/172

(58) Field of Classification Search ..................... 134/4, 134/172, 902

See application file for complete search history.

(56) References Cited

U.S. PATENT DOCUMENTS

| | | | |
|---|---|---|---|
| 3,958,292 | A | 5/1976 | Powell |
| 4,178,188 | A | 12/1979 | Dussault et al. |
| 4,962,776 | A | 10/1990 | Liu et al. |
| 5,120,369 | A | 6/1992 | Malotky |
| 5,690,749 | A | 11/1997 | Lee |
| 5,753,563 | A | 5/1998 | Guan et al. |
| 5,902,678 | A | 5/1999 | Konda et al. |

(Continued)

FOREIGN PATENT DOCUMENTS

JP 3-261142 11/1991

(Continued)

*Primary Examiner*—Ram N. Kackar
(74) *Attorney, Agent, or Firm*—DeLio & Peterson, LLC; John J. Tomaszewski; William D. Sabo

(57) ABSTRACT

An apparatus and method are provided for removing contaminate particulate matter from substrate surfaces such as semiconductor wafers. The method and apparatus use a material, preferably a liquid curable polymer, which is applied as a sacrificial coating to the surface of a substrate containing contaminate particulate matter thereon. An energy source is used to dislodge the contaminate particulate matter from the surface of the wafer into the sacrificial coating so that the particles are partially or fully encapsulated and suspended in the sacrificial coating. The sacrificial coating is then removed. The coating is preferably formed into a film to facilitate removal of the coating by pulling (stripping) the film providing a cleaner substrate surface.

5 Claims, 3 Drawing Sheets

U.S. PATENT DOCUMENTS 6,766,813 B1 * 7/2004 Sayka et al. ................ 134/148
2002/0189635 A1 12/2002 Bodet et al.

FOREIGN PATENT DOCUMENTS

JP 06260464 A 9/1994
JP 07142440 A 6/1995
JP 9260326 A2 10/1997

* cited by examiner

CLEANING OF SEMICONDUCTOR WAFERS BY CONTAMINATE ENCAPSULATION

BACKGROUND OF THE INVENTION

1. Field of the Invention

This invention relates generally to the cleaning of contaminates from substrate surfaces and, in particular, to the fabrication of electronic components such as integrated circuit semiconductors wherein particulate contaminates are removed from the surface of substrates such as semiconductor wafers used to make the electronic component.

2. Description of Related Art

The fabrication of electronic components such as integrated circuit semiconductors is very exacting and complex and requires a number of processing steps requiring extreme precision to form the desired circuit pattern on the component substrate. Typical semiconductor devices now have circuit line widths typically less than 0.5 micron with close spacing of the lines and via interconnections.

Contamination of the semiconductor substrate in the form of particles on the substrate surface may cause short circuits, open circuits and other defects which can cause the component to fail and/or adversely affect the performance of the component. For example, an individual particle as small as 100 angstroms in diameter can result in a defect in a modern microcircuit electronic component.

Cleaning the surface of the semiconductor substrate is therefore a critical step in integrated circuit fabrication and periodic cleaning of the substrate during the fabrication process is needed to maintain product integrity. There are currently numerous methods used to clean substrate surfaces in the electronic industry and basically water or solvents or chemical cleaning are used to remove contaminate particles and films from the surfaces. Chemical solutions are typically combined with megasonic or ultrasonic devices wherein the component to be cleaned is immersed in the chemical solution and the megasonic or ultrasonic devices used to impart high energy sonic waves to the surface of the component which in combination with the chemical solution removes organic films, ionic impurities and contaminate particles from the substrate surface.

A number of cleaning methods are described in U.S. Pat. No. 5,062,898. For example, gas jet cleaning and liquid spray cleaning are used to clean relatively large particles from silicon wafers. Another cleaning technique involves the use of a carbon dioxide aerosol to "sand blast" a contaminated surface.

A process for removing undesired sub-micron particles from a substrate is shown in U.S. Pat. No. 5,456,759 wherein the substrate to be cleaned is placed in a cleaning chamber provided with megasonic energy-producing means. A liquified gas such as liquid carbon dioxide is introduced into the cleaning chamber and the substrate subjected to the liquid carbon dioxide agitated using megasonic energy.

U.S. Pat. Nos. 5,690,749; 5,753,563 and 5,902,678 disclose the use of adhesive tapes which are applied to the surface of a semiconductor and then pulled therefrom to remove particles from the surface of the semiconductor which adhere to the adhesive tape. Japanese Patent No. 6260464 irradiates a cleaned-up mask with laser beams to detect any bonded foreign matter and then an adhesive head discharging a specific amount of adhesive is shifted on the position detected by the sensor to pressure-weld the adhesive head around the foreign matter to remove the foreign matter.

Wafer contamination is still a problem in the electronics and semiconductor fabrication industry however, and as the industry advances and technology is being developed to form smaller and more complex circuits, a more effective and efficient cleaning method to remove particulate foreign matter from substrates is required to produce electronic and semiconductor components.

Bearing in mind the problems and deficiencies of the prior art, it is therefore an object of the present invention to provide a method for removing contaminating particulate matter from a surface such as a wafer substrate used to make electronic components such as semiconductors.

It. is a further object of the present invention to provide an apparatus for removing contaminating particulate matter from a surface such as wafer substrates used to make electronic components such as semiconductor wafers.

It is another object of the present invention to provide electronic component substrates including semiconductor wafers which have been cleaned using the method and apparatus of the invention.

Another object of the invention is to provide electronic components made using electronic component substrates cleaned using the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for removing contaminate particulate matter from a contaminate particle containing substrate surface such as a semiconductor wafer comprising the steps of:

- applying a sacrificial coating of a material, preferably a fluid material, to a substrate surface containing undesirable particulate matter thereon, which material is to encapsulate and suspend the undesirable particles therein;
- fluidizing the material if necessary;
- applying energy to the coated substrate to dislodge at least some of the particulate matter from the surface of the substrate into the sacrificial coating such that the particulate matter is partially or fully encapsulated and suspended within the sacrificial coating forming a particulate matter containing sacrificial material coating; and
- removing the particulate matter containing sacrificial material coating from the substrate surface providing a substrate surface having less particulate matter thereon.

In another aspect of the invention the coating material is a film forming liquid polymer such as polyimide or other such material which, after dislodging the particulate matter, is formed into a flexible film having a strength sufficient for the film to be removed by e.g., pulling the film from the substrate surface.

In an additional aspect of the invention, the energy supplied to the coated substrate to dislodge particulate matter into the sacrificial coating may be sonic, vibrational, centrifugal, and the like, depending on the substrate and/or apparatus used to coat and support the substrate to be cleaned. The energy may be applied to the coated substrate before, during and after application of the sacrificial material coating. The energy may also be applied during forming of the sacrificial material coating into a removable film.

In one aspect, it is contemplated that the substrate will be inclined so that a sacrificial material applied to the upper part of the substrate surface will flow downward over the surface removing particulate matter therefrom.

In a further aspect of the invention the energy applied to dislodge at least some of the contaminating particles from the surface of the substrate into the sacrificial material coating on the surface of the wafer is sonic energy such as ultrasonic energy or megasonic energy.

In still another aspect of the present invention, an apparatus is provided for removing contaminate particulate matter from a contaminate particle containing substrate surface such as a semiconductor wafer comprising:

a support for supporting a substrate containing undesirable particulate matter on the surface of the substrate;

means for applying a sacrificial material coating, preferably a fluid material, on the surface of the substrate, which material is to encapsulate and suspend the undesirable particles therein;

means for fluidizing the material if necessary;

energy forming means to dislodge at least some of the particulate matter from the surface of the substrate into the sacrificial material coating such that the particulate matter is partially or fully encapsulated and suspended within the sacrificial material coating forming a particulate matter containing sacrificial material coating; and means for removing the particulate matter containing sacrificial material coating from the surface of the substrate providing a cleaned substrate surface.

In an additional aspect of the invention the sacrificial coating material is a film forming liquid polymer such as polyimide or other such material which, after dislodging the particulate matter, is formed into a flexible film having a strength sufficient for the film to be removed by, e.g., pulling the film from the substrate surface.

In a further aspect of the invention, the sacrificial material removal means is supplied by inclining the substrate so that a sacrificial material applied to the upper part of the substrate surface will flow downward over the substrate removing particulate matter therefrom.

In another aspect of the present invention, the method and apparatus of the invention may be employed to clean a variety of surfaces having contaminate particles thereon such as circuit boards, medical instruments and optical lenses as well as semiconductor wafers and other substrates used in electronic component fabrication.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
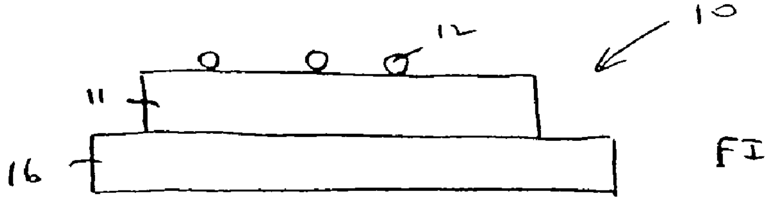
FIGS. 1A-1F are schematic illustrations of a cleaning system of the invention used to remove contaminating particles from a substrate surface.

In describing the preferred embodiment of the present invention, reference will be made herein to FIGS. 1A-3C of the drawings in which like numerals refer to like features of the invention. Features of the invention are not necessarily shown to scale in the drawings.

The present invention is applicable to cleaning processes for cleaning a wide variety of substrates such as circuit boards, medical instruments and optical lenses and in particular electronic component substrates such as semiconductor wafers used in the fabrication of integrated circuits. Particulate contaminant materials which may be removed from substrates in accordance with the present invention include, but are not limited to, solder flux residues, photoresist, particulates comprising inorganic or organic materials, adhesive residues, plasticizers, unreacted monomers, and the like.

Typical substrates from which particulate contaminants may be removed in accordance with the present invention include, but are not limited to, substrates formed of silicon, metal, rubber, plastic, cotton, cellulose, ceramics, and other organic or inorganic materials. The following description will be directed for convenience to semiconductor wafers used in electronic component fabrication, although it will be appreciated by those skilled in the art that other substrates may suitably be cleaned using the methods and apparatus of the invention.

The particle size of the contaminate particulate matter to be removed from a substrate surface such as a semiconductor wafer is usually up to about 1,000 microns, or higher, and be as low as about 0.1 micron.

The present invention may be broadly stated as comprising a method and apparatus for cleaning semiconductor wafer substrates comprising applying a sacrificial coating of a material to a substrate surface containing undesirable particles thereon which material is preferably a fluid (e.g., liquid) or which can be fluidized with the sacrificial material coating being capable of holding the particles in suspension therein for a time sufficient to enable the coating to be removed from the substrate and preferably to be formed into a removable (preferably strippable) film which will partially or fully encapsulate the particles. Energy is applied to the coated substrate to dislodge at least some of the particles from the surface into the sacrificial material coating with the particles being partially or fully encapsulated and suspended in the sacrificial material. The sacrificial coated material containing the suspended particulate matter is then preferably formed into a film which is removed from the substrate surface providing a cleaner substrate surface having fewer contaminating particles thereon. It is also contemplated herein that the coating may. be formed into a film simultaneously with application of the energy to dislodge the particles. If the coated material is not formed into a film, it may be removed by a physical action such as pushing from the substrate surface. The coated material may also be a sacrificial material applied to the upper part of an inclined substrate which flows downward by gravity and removes particulate matter on the substrate surface because the gravity supplies the energy to remove the fluid and entrained particles from the substrate surface.

The material used to coat the surface of a substrate will typically be a semi- solid or viscous fluid, preferably a liquid and more preferably a polymeric material, which is suitable to form a coating typically having a thickness of about 1 micron to 10,000 microns, or thicker. Suitable polymeric materials include polyimide, lacquer, latex and rubber cement.

An alternate material can be a semi-solid like polymeric powder, which when heated or irradiated cross-links to form a film which can then be removed.

The sacrificial material coating is preferably formed into a film, e.g., curable, so that a molecular structure is formed which has a higher strength, e.g., tensile, than the original coated sacrificial material. The increased strength and formation of a film facilitates removal of the film by any physical action, e.g., a pulling action, pushing action or compression, etc., to remove the film containing the dislodged and suspended particles from the surface of the substrate. If a film is not formed, the fluid material may be removed by a physical action such as pushing.

While it is preferred that the sacrificial coating material be a liquid, other materials capable of forming a coating and preferably a film on the substrate surface which can support and encapsulate particulate matter include gases or vapors such as silane. A liquid polymer curable material such as polyimide is preferred.

The sacrificial material may be applied to form a coating on the substrate using any of a number of techniques such as immersion, brushing on, spin on coating, spraying, and the like.

The energy employed in the present invention to dislodge the particles from the substrate surface into the fluid material coating may be provided by known means. It is preferred to use sonic energy such as ultrasonic and megasonic energy which is produced by a high frequency transducer that transmits energy having a frequency typically up to about 2000 Kilohertz. The frequency is preferably about 10 to 1000 Kilohertz. Such ultrasonic and megasonic energy transmitting transducers are commercially available. The power levels may be adjusted depending on the particulate contaminant to be removed and/or the degree of cleaning desired as will be appreciated by those skilled in the art. The energy providing transducers may be directed at the surface of the coating during and/or after application of the sacrificial material coating to energize the substrate and coating to dislodge the particles into the coating.

Energy can also be applied to the substrate or substrate support directly to dislodge the particles. Energy means such as a vibrator can be used to vibrate the substrate and dislodge the particles. Centrifugal means can also be used to dislodge the particles. Other means include magnetic forces, thermal means, lasers, electrostatic, etc. Gravity forces may also be used with an inclined substrate as discussed above and as shown in FIGS. 3A-3C.

In a preferred aspect of the invention where a polymeric sacrificial coating or other curable coating is cured to form a film and increase the strength of the coating, the curing may be performed by any of the well known methods such as thermal curing, ultraviolet curing, and the like. Other film forming methods for other materials include drying, cooling, freezing, heating, chemically reacted film formation and crystallization.

Referring now to the figures, FIG. 1A shows a semiconductor wafer electronic component generally as numeral 10 which comprises a wafer substrate 11 having contaminate particulate matter 12 on the surface thereof. The wafer substrate is supported on a base 16.

Figure 1B:
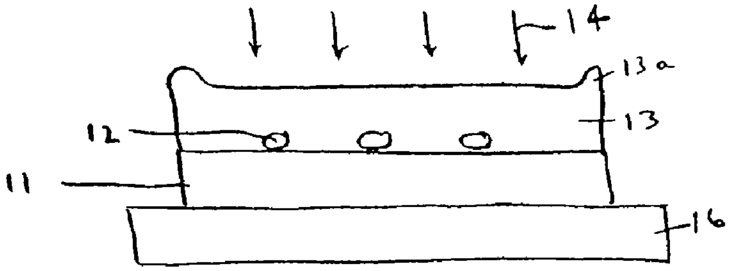

In FIG. 1B the surface of substrate 11 is coated with a liquid viscous polymeric material 13 such as polyimide in a thickness of, e.g., about 6 microns. The coating may be applied by any suitable means such as spin-on-coating. The coating 13 has an edge bead 13a formed by the spin coating which is helpful for removing the coating (formed into a film) at the end of the process. The edge bead however may collapse by gravity depending on the polymeric material 13 used. The contaminate particles 12 generally remain on the surface of the wafer 11 although some could be dislodged into the coating during application of the coating. An energy source 14 is shown directed at the surface of the liquid polymeric material 13.

Figure 1C:
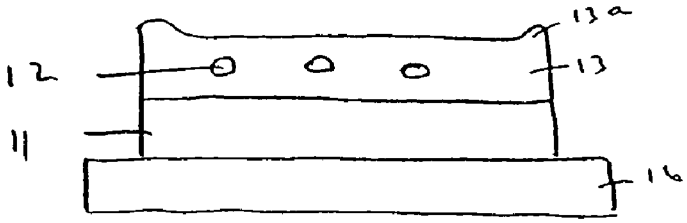

In FIG. 1C the effect of the energy source 14 on the substrate is shown wherein the particles 12 have been dislodged from the surface of substrate 11 and are now suspended (encapsulated) in the liquid polymeric material coating layer 13.

Figure 1D:
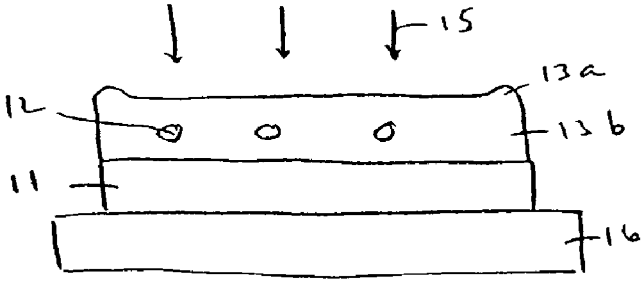

In FIG. 1D untraviolet, heat or other curing energy source 15 is provided to cure the polymeric material coating layer 13 forming a cured film shown as 13*b*. The cured film 13*b* has a high tensile strength and the particles 12 are tightly held (suspended) in the film coating.

Figure 1E:
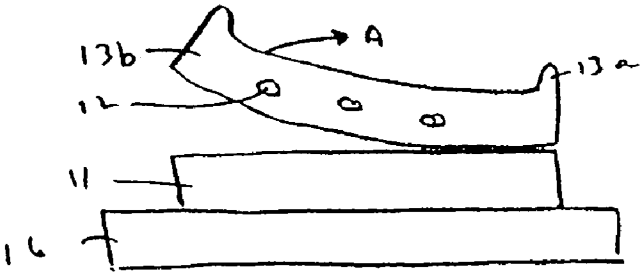

FIG. 1E shows removal of the cured film 13*b* by a pulling action shown by arrow A removing the cured polymeric material film 13*b* from the surface of the substrate 11. Particulate matter 12 suspended or encapsulated in film 13*b* is removed with film 13*b* by the pulling action.

Figure 1F:
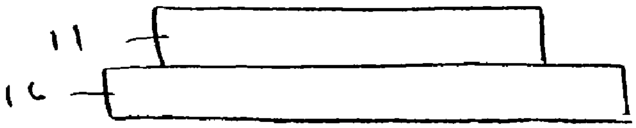

FIG. 1F shows a clean substrate 11 surface wherein the contaminating particles 12 of FIG. 1A have been removed using the method and apparatus of the invention.

Referring now to FIGS. 2A-2F a similar method for removing particles from a substrate surface is shown as in FIGS. 1A-1F except for the energy source 14 used to dislodge the particles.

Figure 2A:
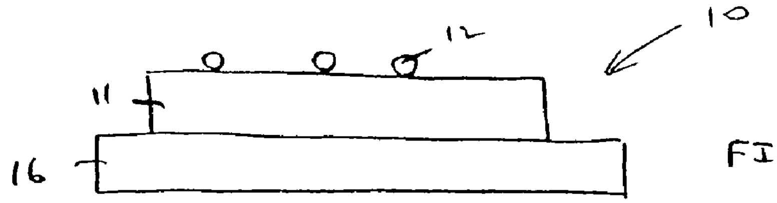
FIGS. 2A-2F are schematic illustrations of another cleaning system of the invention used to remove contaminating particles from a substrate surface.
Figure 2B:
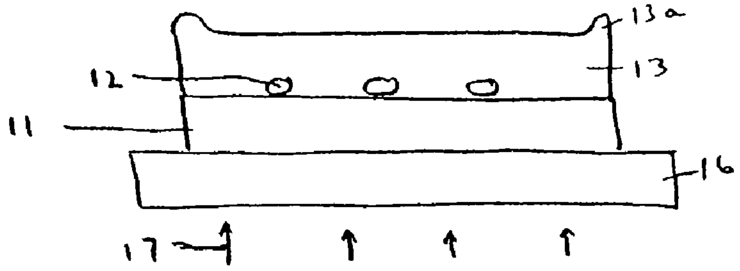
Figure 2C:
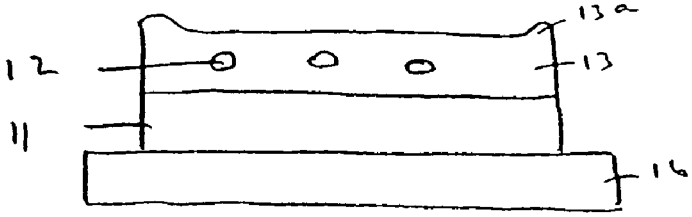

Accordingly, FIG. 2A shows a semiconductor wafer electronic component generally as numeral 10 which comprises a wafer substrate 11 having contaminate particulate matter 12 on the surface thereof. The substrate is supported on base 16. In FIG. 2B, an energy force is shown as 17 which is directed at the base 16 and may be, for example, a vibrational energy source, a centrifugal energy force, or the like. The purpose of the energy source 17 is to dislodge the particles 12 from the surface of substrate 11 so that they are partially or totally encapsulated in coating 13 as shown in FIG. 2C.

Figure 2D:
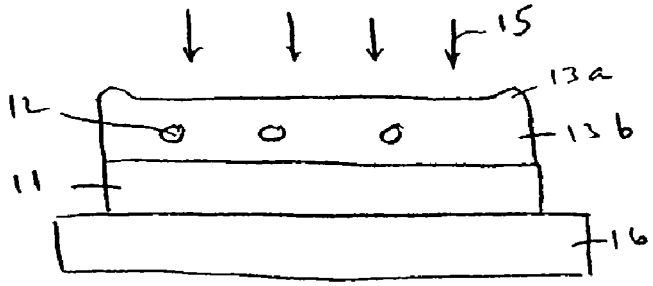
Figure 2E:
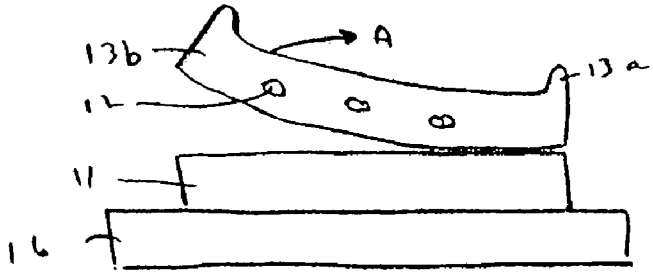
Figure 2F:
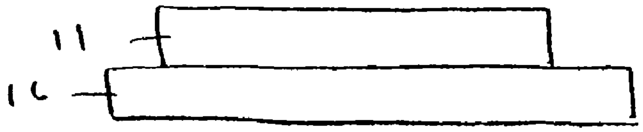

FIGS. 2D-2F parallel FIGS. 1D-1F wherein an energy source 15 is applied to form fluid material coating 13 into film 13*b*. In FIG. 2E, film 13*b* containing particulate matter 12 is removed by a pulling action shown by arrow A removing the film 13*b* (and particles 12) from the surface of substrate 11. FIG. 2F shows a clean substrate 11 surface wherein the contaminating particles 12 of FIG. 2A have been removed using the method and apparatus of the invention.

Figure 3A:
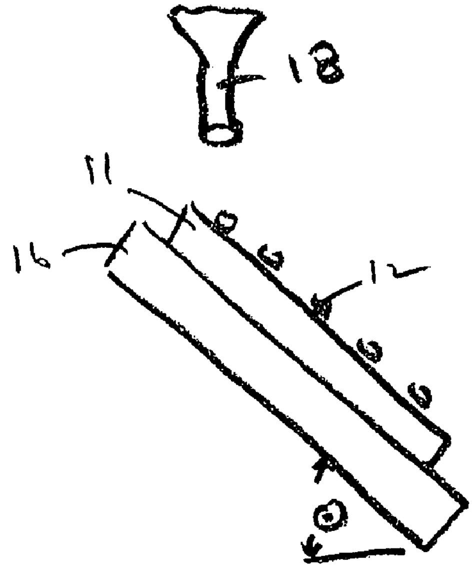
FIGS. 3A-3C are schematic illustrations of another cleaning system of the invention using an inclined plane to remove contaminating particles from a substrate surface.
Figure 3B:
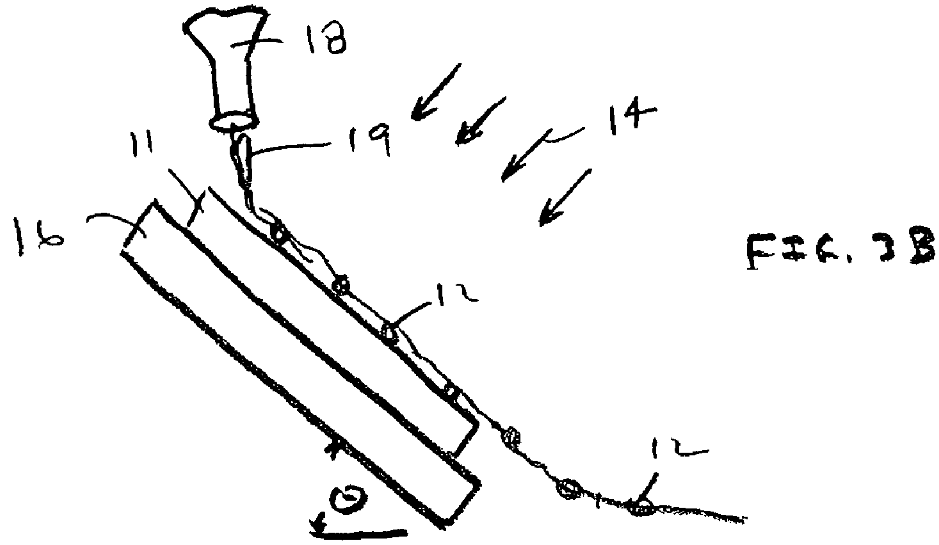
Figure 3C:
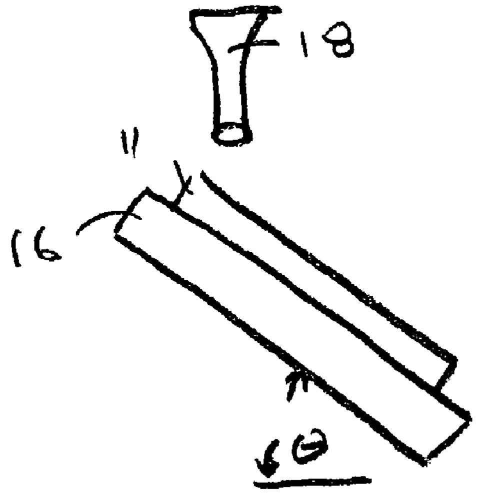

Referring now to FIGS. 3A-3C, the figures show an embodiment of the invention which utilizes gravitational forces to remove particulate matter containing sacrificial material coating from the surface of a substrate. FIG. 3A shows a wafer substrate electronic component 11 having contaminate particulate matter 12 on the surface thereof. The wafer substrate 11 is shown inclined and supported on a base 16. The inclined angle θ may be any suitable angle such as 45° to provide an inclined surface. A dispensing device 18 is shown positioned above the upper part of wafer substrate 11.

FIG. 3B shows a fluid material 19 such as polyimide being dispensed from nozzle 18 onto the upper part of wafer substrate 11. The fluid material 19 flows downward over substrate surface 11 and energy is applied (14) to dislodge particles 12 and promote encapsulation and removes particles 12 by the downward flowing movement of the fluid material 19. FIG. 3C shows the wafer substrate 11 after the cleaning process wherein the contaminating particles 12 have been removed from the surface of wafer substrate 11.

EXAMPLE

Using the method and apparatus shown in FIGS. 1A-1F, a liquid polyimide coating was applied to a semiconductor wafer surface at a thickness of about 6 microns. Megasonic energy was used to dislodge contaminated particles from the wafer surface into the coating. The coating was heated for 1 hour at 350° C. forming a 4.5 micron cured polyimide film. The film containing the contaminant particles was easily stripped (peeled) from the wafer providing a cleaner wafer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for removing contaminate particulate matter from a contaminate particle containing integrated circuit semiconductor substrate surface comprising:

a support for supporting an integrated circuit semiconductor substrate containing undesirable particulate matter on the surface of the substrate;

means for applying a sacrificial coating of a curable polymer on the surface of the substrate, which curable polymer is to encapsulate and suspend the undesirable particles therein;

means for fluidizing the curable polymer if necessary;

energy forming means to dislodge at least some of the particulate matter from the surface of the integrated circuit semiconductor substrate into the fluid curable polymer sacrificial coating such that the particulate matter is partially or fully encapsulated and suspended within the sacrificial curable polymer coating forming a particulate matter containing curable polymer sacrificial coating;

means for curing the fluidized particulate matter containing curable polymer sacrificial coating to form a cured polymer strippable film containing the particulate matter; and means for removing the particulate matter containing curable polymer sacrificial strippable film from the surface of the substrate as a strippable film providing a substrate surface having less particulate matter therein and a stripped film containing the particles.

2. The apparatus of claim 1 wherein the sacrificial coating curable polymer is a fluid.

3. The apparatus of claim 1 wherein the energy is sonic energy.

4. The apparatus of claim 1 wherein the energy means is thermal, centrifugal, magnetic or vibrational.

5. The apparatus of claim 1 wherein the sacrificial coating curable polymer is a liquid.

* * * * *